United States Patent [19]

Boudewijns

[11] Patent Number: 4,972,098
[45] Date of Patent: Nov. 20, 1990

[54] INTEGRATED VARIABLE RESISTOR CIRCUIT HAVING MOS TRANSISTORS

[75] Inventor: Arnoldus J. J. Boudewijns, Eindhoven, Netherlands

[73] Assignee: U.S. Philips Corp., New York, N.Y.

[21] Appl. No.: 466,178

[22] Filed: Jan. 17, 1990

[30] Foreign Application Priority Data

Jan. 25, 1989 [NL] Netherlands ............... 8900175

[51] Int. Cl.⁵ ............... G11C 11/40; H03K 3/354
[52] U.S. Cl. .............. 307/296.8; 307/279; 307/304; 365/154
[58] Field of Search ............ 307/304, 279, 574, 580, 307/581, 584, 296.1, 298.6; 365/148, 182, 184, 154, 156

[56] References Cited

U.S. PATENT DOCUMENTS

| | | | |
|---|---|---|---|
| 3,636,530 | 1/1972 | Mark et al. | 365/184 |
| 4,110,639 | 8/1978 | Redwine | 307/270 |
| 4,170,741 | 10/1979 | Williams | 365/184 |
| 4,224,686 | 9/1980 | Aneshansley | 365/184 |
| 4,348,745 | 9/1982 | Schmitz | 365/154 |
| 4,435,786 | 3/1984 | Tickle | 365/154 |
| 4,460,978 | 7/1984 | Jiang et al. | 365/185 |
| 4,467,451 | 8/1984 | Moyer | 365/185 |
| 4,751,676 | 6/1988 | Momodoin | 365/154 |
| 4,901,279 | 2/1990 | Plass | 365/182 |

Primary Examiner—Stanley D. Miller
Assistant Examiner—Hanh Nguyen
Attorney, Agent, or Firm—Steven R. Biren

[57] ABSTRACT

An integrated variable resistor in MOS technology comprises two parallel-connected transistors (T1, T2) whose electrodes are floating relative to the substrate (8). Its resistance is controlled by means of current sources (3, 4, 5, 6) whose current flows through the transistors (T3, T4) arranged as resistors. The body effect in the transistors (T1, T2) is compensated for by an equally large body effect in the transistors (T3, T4).

1 Claim, 3 Drawing Sheets

INTEGRATED VARIABLE RESISTOR CIRCUIT HAVING MOS TRANSISTORS

BACKGROUND OF THE INVENTION

The invention relates to an integrated transistor circuit in MOS-technology, constructed to form a variable resistor between a first terminal and a second terminal and comprising a first and a second transistor each having a control electrode and a main current path between a first and a second main electrode, the first and the second main electrode of the first transistor being coupled to the first and the second terminal respectively and the first and the second main electrode of the second transistor being coupled to the second and the first terminal respectively, a third and a fourth transistor each having a control electrode and a main current path between a first and a second main electrode, and a first and a second controllable current source coupled to the main current path of the third and the fourth transistor respectively.

Such a circuit is disclosed in P. E. Allen and D. R. Holberg: "CMOS Analog Circuit Design", page 217, FIG. 5.2-5, Holt, Rinehart and Winston. In integrated MOS circuits it is common practice to employ active MOS transistors as resistors instead of passive polysilicon or diffused passive resistors. Generally, active resistors not only have a smaller surface area than equivalent passive resistors but they are also adjustable. In said active resistors the channel of the main current path between the main electrodes (source, drain) of the MOS transistor functions as the resistor. The resistance of the channel is controlled by means of a variable voltage between the control electrode (gate) and the first main electrode (source) of the MOS transistor. However, the channel resistance of the main current path depends not only on the selected gate-source voltage but also on the value and polarity of the drain-source voltage. The channel resistance of the main current path is substantially constant over a specific range of drain-source voltage, so that it may be referred to as a voltage-independent linear resistance. However, as the drain-source voltage increases the non-linear relationship inherent in MOS transistors, between drain-source current in and drain-source voltage across the main current source becomes manifest. As a result of this the drain-source voltage range within which the channel resistance of a MOS transistor remains fairly constant is rather limited. A further limitation is imposed by what is referred to as the "body effect" or "bulk effect", sometimes also "backgate effect", of an integrated MOS transistor. This effect manifests itself if the voltage difference between the substrate of the integrated circuit and the first main electrode (source) of the main current path of an integrated MOS transistor is not constant. This is so in particular if the MOS transistor is arranged as a resistor which is floating relative to the substrate. The substrate then behaves as an additional control electrode (backgate), which adversely affects the channel resistance of the main current path. The body effect also has a non-linear influence on the channel resistance.

Said prior-art transistor circuit provides a solution to arrive at an extended voltage range within which the main current path of a floating MOS transistor arranged as an active resistor can be used as a linear resistor. In order to form an active controllable resistor the main current path of a first transistor and a second transistor are arranged in parallel between a first and a second terminal. The bias voltages on the control electrodes of the first and the second transistor are respectively furnished by a first controllable current source coupled to the main current path of a third transistor and by a second controllable current source coupled to the main current path of a fourth transistor. In this prior-art configuration the non-linear effects on the channel resistance caused by the non-linear behavior inherent in an integrated transistor are compensated for by cross-coupling the main electrodes of the first and the second transistor. The non-linear effects then cancel one another, resulting in a substantial extension of the range of drain-source voltages within which the resistor thus formed is linear. Although the above-mentioned book states that cross-coupling also results in the body effect in the first transistor being cancelled by the body effect in the second transistor, this is not or not entirely true. In the prior-art circuit the instantaneous voltages across the main current paths of the first and the second transistor still influence the backgate-source voltages of these transistors.

SUMMARY OF THE INVENTION

It is the object of the invention to provide an integrated active variable MOS resistor in which the body effect in the first and the second transistor is minimized. To this end an integrated MOS transistor circuit in accordance with the invention is characterized in that the control electrode of the third transistor is coupled to the second main electrode of the third transistor and to the control electrode of the first transistor, the control electrode of the fourth transistor is coupled to the second main electrode of the fourth transistor and to the control electrode of the second transistor, the first main electrode of the first transistor is coupled to the first main electrode of the third transistor, and the first main electrode of the second transistor is coupled to the first main electrode of the fourth transistor.

The current from the first and the second controllable current source flows through the main current path of the third and the fourth transistor respectively, which transistors are arranged as resistors by connecting their control electrodes to their second main electrodes. The voltage drop across the main current path of the third and the fourth transistor provides the bias voltage between the control electrode and the first main electrode of the first and the second transistor respectively. Since the first main electrode is floating relative to the substrate the body effect of the first and the second transistor is compensated for by an equal body effect in the third and the fourth transistor respectively, whose backgates, as well as those of the first and the second transistor, may now be connected directly to the substrate of the integrated

BRIEF DESCRIPTION OF THE DRAWING

The invention will now be described in more detail, by way of example, with reference to the accompanying drawing, in which.

DESCRIPTION OF THE PREFERRED EMBODIMENTS

Figure 1:
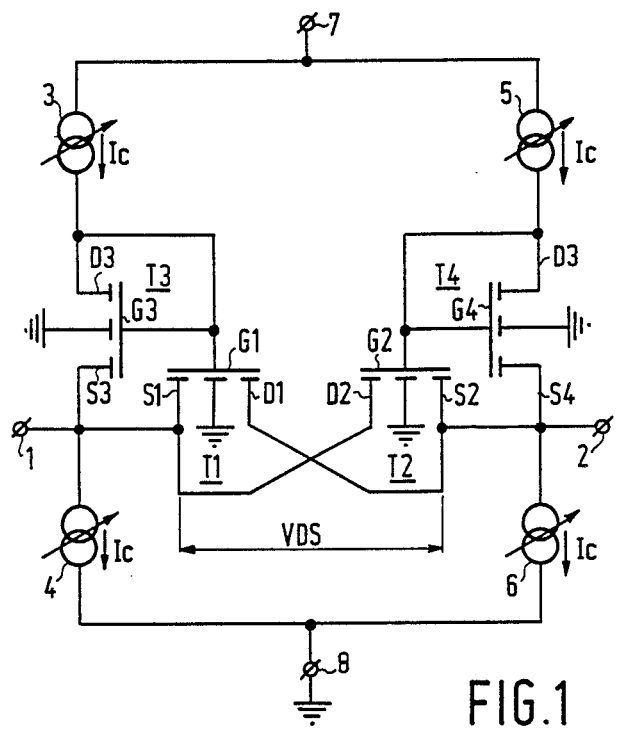
FIGS. 1 and 3 are circuit diagrams of embodiments of a variable MOS resistor in accordance with the invention.

FIG. 1 is the circuit diagram of an integrated transistor circuit enabling a variable resistor to be realized which is floating relative to the substrate of the integrated circuit. Use is made of enhancement-type NMOS transistors, but it is also possible to use depletion-type transistors, if desired in PMOS technology, provided that the supply voltages and bias current sources to be described hereinafter are adapted accordingly. The transistors comprise a first and a second main electrode and a control electrode, which respectively correspond to the source, the drain and the gate of a MOS transistor. The electrodes are referenced S, D and G respectively suffixed with the numeral of the relevant transistor. The main current paths of a first transistor T1 and a second transistor T2 are arranged between a first terminal 1 and a second terminal 2, in such a way that the first terminal 1 is connected to the source S1 of the transistor T1 and the drain D2 of the transistor T2 and that the second terminal 2 is connected to the drain D1 of the transistor T1 and the source S2 of the transistor T2. The main current paths of the transistors T1 and T2 are consequently arranged in parallel in opposing fashion. The parallel arrangement of the main current paths of the transistors T1 and T2 constitutes a variable resistor arranged between the terminals 1, 2 and having a resistance value determined by the gate-source voltage of the first and the second transistor. The gate-source voltage for the first transistor T1 is supplied by a bias circuit mainly comprising a third transistor T3, substantially identical to the transistor T1, and the controllable current sources 3 and 4. The transistor T3 has its drain D3 and its gate G3 interconnected and connected to the gate G1 of the transistor T1, its source S3 being connected to the source S1 of the transistor T1. The main current path of the transistor T3 is coupled to a first supply terminal 7 via the controllable current source 3 and to a second supply terminal 8 via the controllable current source 4. In the present example utilizing NMOS enhancement transistors the supply voltage on the terminal 7 should be positive relative to that on the terminal 8, which is connected to ground. Similarly, the gate-source voltage of the transistor T2 is generated by a transistor T4, which is substantially identical to T2, and two controllable current sources 5 and 6, the corresponding elements of the transistors T2 and T4 and the current sources 5 and 6 being arranged in the same way as those of the transistors T1 and T3 and the current sources 3 and 4, respectively.

The current sources 3, 4, 5 and 6 are controllable and their currents all have the same value Ic. The current Ic from the current source 3 flows to the current source 4 through the main current path of the transistor T3 and the current Ic from the current source 5 flows to the current source 6 through the main current path of the transistor T4.

Figure 2A:
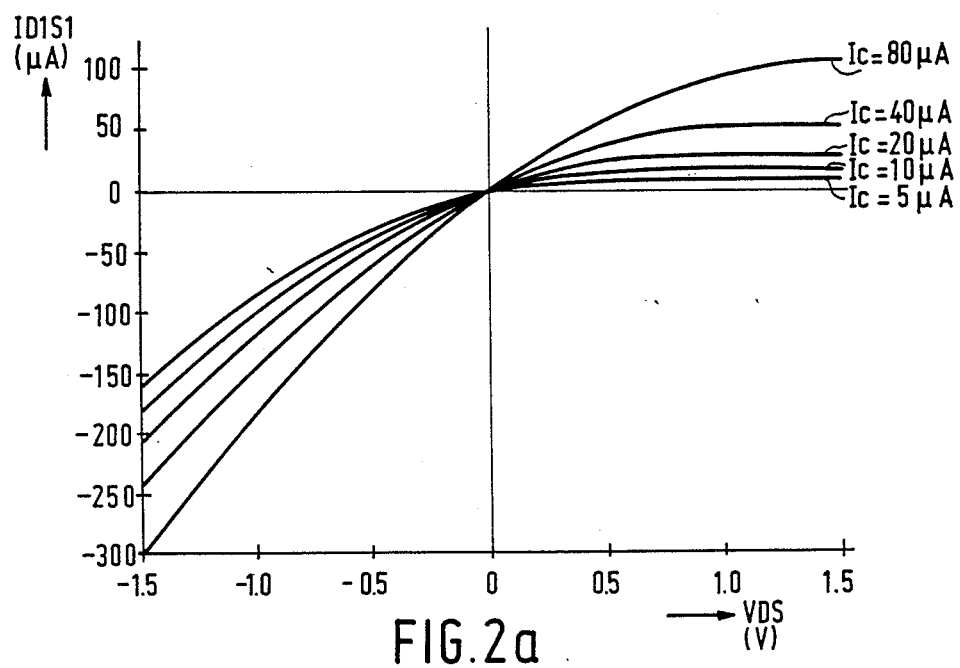
FIGS. 2($a$–$c$) shows characteristic curves to explain the characteristics of the embodiment shown in FIG. 1.
Figure 2B:
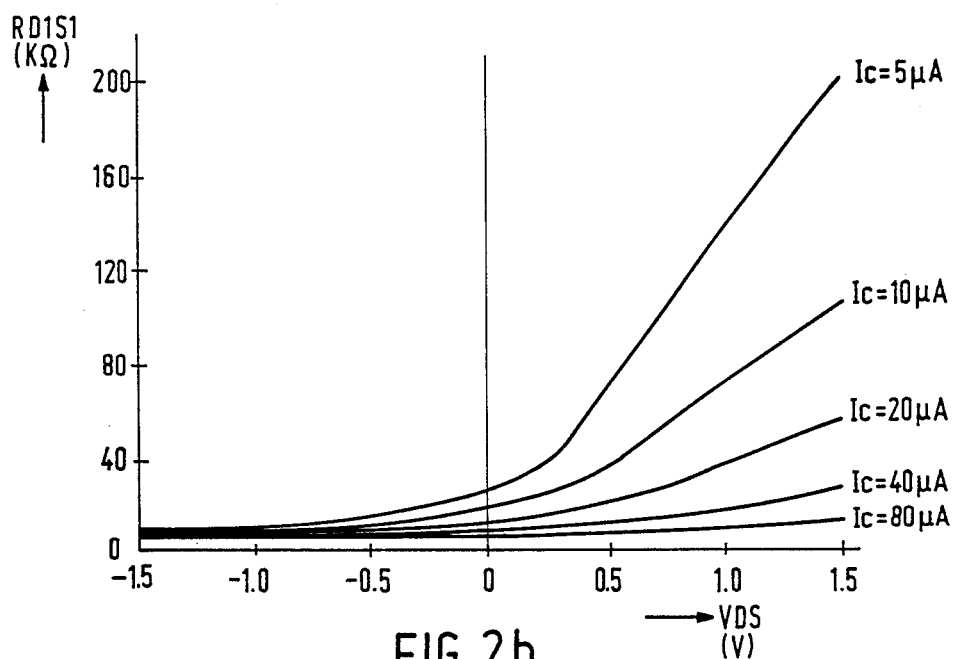
Figure 2C:
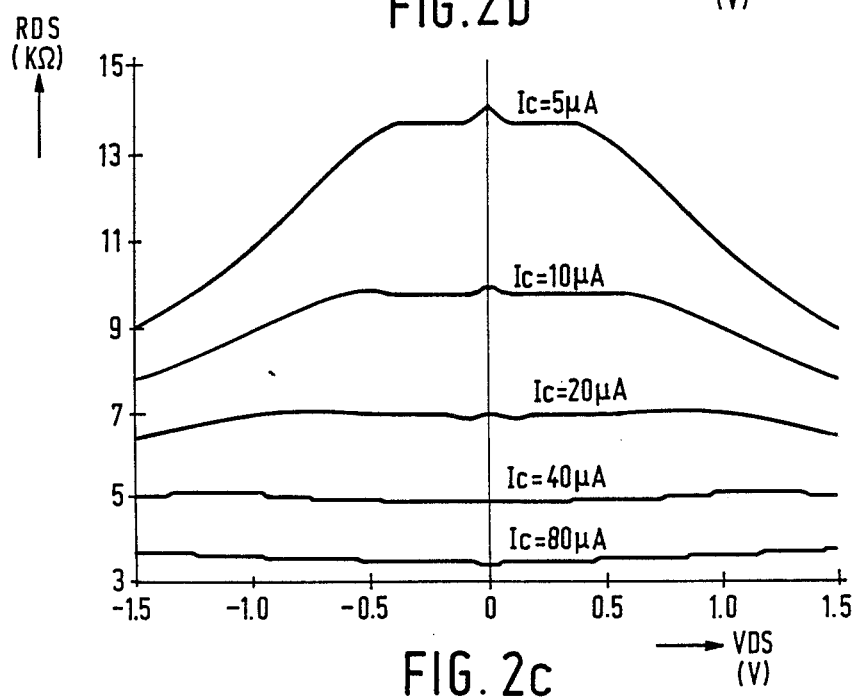

To illustrate the operation of the circuit, FIG. 2a shows a graph in which the current ID1S1 through the main current path of the transistor T1 is plotted versus the voltage VDS across the main current path of the transistor T1 for five different values Ic of the controllable current sources 3 and 4. The values given for the currents and voltages merely serve for the purpose of illustration and may differ for different process parameters. Dividing the value of the voltage VDS by the value of the current ID1S1 yields the resistance RD1S1 of the transistor T1. The result is shown in FIG. 2b, in which the resistance RD1S1 of the transistor T1 is plotted versus the voltage VDS of the transistor T1 for five differently selected bias currents Ic. The Figure clearly shows how the resistance RD1S1 varies depending on the instantaneous voltage VDS. By connecting an identically-controlled transistor T2—as already shown in FIG. 1—in parallel with the transistor T1 but with the drain and source exchanged crosswise, it is possible to compensate for the non-linear behavior of the resistance RD1S1. The result is shown in FIG. 2c. In this Figure the overall resistance RDS of the parallel-connected main current paths of the transistors T1 and T2 is given as a function of the voltage VDS across the main current paths for the five selected bias currents Ic. The range VDS within which the resistance RD remains substantially constant is extended significantly in comparison with RD1S1 in FIG. 2b.

Figure 3:
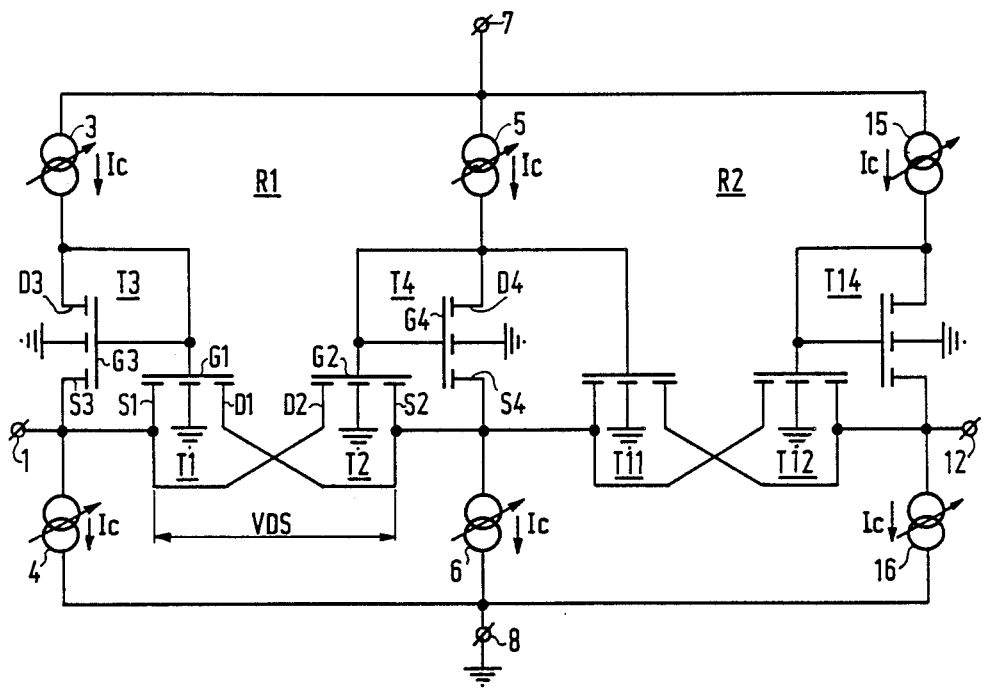

The transistor circuit in accordance with the invention can be employed as a floating variable resistor in an integrated MOS transistor circuit. An example of such a circuit is a filter arrangement with a variable time constant. Variable resistors of larger value can be obtained by arranging a plurality of resistors in series in a manner as shown in FIG. 3. This Figure by way of example shows two variable resistor circuits as shown in FIG. 1 arranged in series. However, here the controllable current sources 5 and 6 and the transistor T4 supply not only the gate-source voltage of the transistor T2 of the first variable resistor R1 but also that or the transistor T11 of the second variable resistor R2. The second variable resistor R2 further comprises the transistors T12 and T14 and the controllable current sources 15 and 16, which respectively correspond to the transistors T2 and T4 and the current sources 5 and 6 of the first variable resistor R1 and which are arranged in a similar way.

I claim:

1. An integrated transistor circuit having MOS transistors constructed to form a variable resistor between a first terminal and a second terminal and comprising:
    a first and a second transistor, each having a control electrode and a main current path between a first and a second main electrode, the first and the second main electrode of the first transistor being coupled to the, first and the second terminal, respectively, and the first and the second main electrode of the second transistor being coupled to the second and the first terminal, respectively;
    a third and a fourth transistor each having a control electrode and a main current path between a first and a second main electrode; and
    a first and a second controllable current source coupled to the main current path of the third and the fourth transistor, respectively characterized in that:
    the control electrode of the third transistor is coupled to the second main electrode of the third transistor and to the control electrode of the first transistor;
    the control electrode of the fourth transistor is coupled to the second main electrode of the fourth transistor and to the control electrode of the second transistor;
    the first main electrode of the first transistor is coupled to the first main electrode of the third transistor; and
    the first main electrode of the second transistor is coupled to the first main electrode of the fourth transistor.

* * * * *